(12) United States Patent
Liu et al.

(10) Patent No.: US 6,965,241 B1
(45) Date of Patent: Nov. 15, 2005

(54) AUTOMATED ELECTRONIC CALIBRATION APPARATUS

(75) Inventors: James C. Liu, Santa Rosa, CA (US); Kenneth H. Wong, Santa Rosa, CA (US); Robert L. Shimon, Santa Rosa, CA (US); Paul E. Cassanego, Santa Rosa, CA (US); Srinivas M. Sundaram, Santa Rosa, CA (US); Shigetsune Torin, Santa Rosa, CA (US); Richard R. Hawkins, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 58 days.

(21) Appl. No.: 10/680,329

(22) Filed: Oct. 7, 2003

(51) Int. Cl.[7] .............................................. G01R 35/00
(52) U.S. Cl. ..................... 324/601; 324/76.23; 324/638
(58) Field of Search ............................ 324/601, 76.23, 324/638; 702/85

(56) References Cited

U.S. PATENT DOCUMENTS

| | | | |
|---|---|---|---|
| 5,434,511 A | 7/1995 | Adamian et al. | 324/601 |
| 5,467,021 A | 11/1995 | Adamian et al. | 324/601 |
| 5,537,046 A | 7/1996 | Adamian et al. | 324/601 |
| 5,548,221 A | 8/1996 | Adamian et al. | 324/601 |
| 5,548,538 A | 8/1996 | Grace et al. | 702/85 |
| 5,552,714 A | 9/1996 | Adamian et al. | 324/601 |
| 5,578,932 A | 11/1996 | Adamian | 324/601 |
| 5,587,934 A | 12/1996 | Oldfield et al. | 702/85 |
| 6,300,775 B1 * | 10/2001 | Peach et al. | 324/601 |
| 6,417,674 B1 | 7/2002 | Rowell, Jr. et al. | 324/601 |
| 6,421,624 B1 * | 7/2002 | Nakayama et al. | 702/117 |
| 6,826,506 B2 * | 11/2004 | Adamian et al. | 702/118 |

OTHER PUBLICATIONS

"HP 8712C and HP 8714C RF Network Analyzer User's Guide", Part No. 08712-90056, Oct., 1996, pp. 6-1 through 6-14, available from Agilent Technologies, Inc.

* cited by examiner

Primary Examiner—Walter Benson (57) ABSTRACT

Testing is performed on a device under test. A first port of a first calibration module is connected to the device under test. A second port of the first calibration module is connected to a network analyzer. A first port of a second calibration module is connected to the device under test. A second port of the second calibration module is connected to the network analyzer. A measurement calibration and testing are performed without disconnecting the first port and the second port of the first calibration module and without disconnecting the first port and the second port of the second calibration module.

12 Claims, 5 Drawing Sheets

AUTOMATED ELECTRONIC CALIBRATION APPARATUS

BACKGROUND

The present invention concerns radio frequency and microwave network analyzers and pertains particularly to an automated electronic calibration apparatus.

A network analyzer typically integrates a synthesized signal source with built-in signal separation devices, receivers, a display and a processor.

Measurement calibration is a process that characterizes the systematic errors of a network analyzer. This information can be used to improve measurement accuracy by using error correction arrays during signal processing to compensate for systematic measurement errors. Measurement calibration is also called Cal, a short form of calibration. Error correction is also called accuracy enhancement. Measurement errors are classified as random and systematic errors. Random errors, such as noise and connector repeatability are non-repeatable and not correctable by measurement calibration and error correction.

Systematic errors, such as tracking and crosstalk, are the most significant errors in most network analyzer measurements. Systematic errors are repeatable and for the most part correctable, though small residual errors may remain. These systematic errors may drift with time and temperature and therefore require new measurement calibrations to maintain error corrected measurement accuracy.

Systematic errors are due to system frequency response, isolation between the signal paths, and mismatch in the test setup. Frequency response errors (transmission and reflection tracking) result from the difference of the test signal path and receiver with respect to the reference signal path and receiver that are a function of frequency.

Isolation errors result from energy leakage between signal paths in measurements. This leakage is due to crosstalk. In reflection measurements, the leakage is also due to imperfect directivity. Directivity is the ability of the signal separation devices to separate forward traveling signals from reverse traveling signals.

Mismatch errors result from differences between the port impedance of the device under test (DUT) and the port impedance of the network analyzer. Source match errors are produced on the source (network analyzer OUT) side of the DUT. Load match errors are produced on the load (network analyzer IN) side. If the DUT is not connected directly to the ports, the mismatch errors due to cables, adapters, etc. are considered part of the source or load match errors.

The network analyzer has several methods of measuring and compensating for these test system errors. Each method removes one or more of the systematic errors using equations derived from an error model. Measurement of high quality standards (for example, short, open, load, through) allows the network analyzer to solve for the error terms in the error model. The accuracy of the calibrated measurements is dependent on the quality of the standards used and the stability of the measurement system. Since calibration standards are very precise, great accuracy can be achieved.

To perform a transmission calibration, at least four measurement standards are utilized: for example, an open, a short, a load, and a through cable. The network analyzer measures each standard across a defined frequency band using a pre-defined number of points. The measurement of these standards is used to solve for the error terms in the error model and to remove systematic errors caused by transmission frequency response, load match and source match.

To perform a reflection calibration, a one-port calibration is performed using at least three measurement standards, such as an open, a short, and a load. The network analyzer measures each standard across a predefined frequency band using a pre-defined number of points. The measurements of these standards are used to solve for the error terms in the error model and to remove systematic errors caused by directivity, source match and reflection frequency response.

For further information about calibration of network analyzers, see for example, the *HP 8712C and HP 8714C RF Network Analyzer User's Guide*, Part No. 08712–90056, October, 1996, pp. 6–1 through 6–14, available from Agilent Technologies, Inc.

In order to reduce the time required for calibration various systems have incorporated some automated features. For example U.S. Pat. No. 5,434,511, U.S. Pat. No. 5,467,021, U.S. Pat. No. 5,537,046, U.S. Pat. No. 5,548,221, U.S. Pat. No. 5,552,714 and U.S. Pat. No. 5,578,932 discuss electronic calibration accessories that perform computer-assisted calibrations with electronic standards, making the calibration process less time-consuming and error-prone. When using these electronic calibration accessories it is necessary to manually connect a module to the measurement ports. U.S. Pat. No. 5,587,934 also sets out an electronic calibration module that uses manual connections. U.S. Pat. No. 5,548,538 discloses a technique for including calibrations internal to the network analyzer. This technique involves the addition of a precisely characterized two-port module in front of the test set ports. An error matrix is determined for this two-port module relative to known standards at the test set ports. This error matrix can then be used to calculate the reflection coefficients of the electronic calibration standards inside the two-port module and to enable future automatic calibrations.

SUMMARY OF THE INVENTION

In accordance with embodiments of the present invention, testing is performed on a device under test. A first port of a first calibration module is connected to the device under test. A second port of the first calibration module is connected to a network analyzer. A first port of a second calibration module is connected to the device under test. A second port of the second calibration module is connected to the network analyzer. A measurement calibration and testing are performed without disconnecting the first port and the second port of the first calibration module and without disconnecting the first port and the second port of the second calibration module.

DETAILED DESCRIPTION OF EMBODIMENTS OF THE INVENTION

Figure 1:
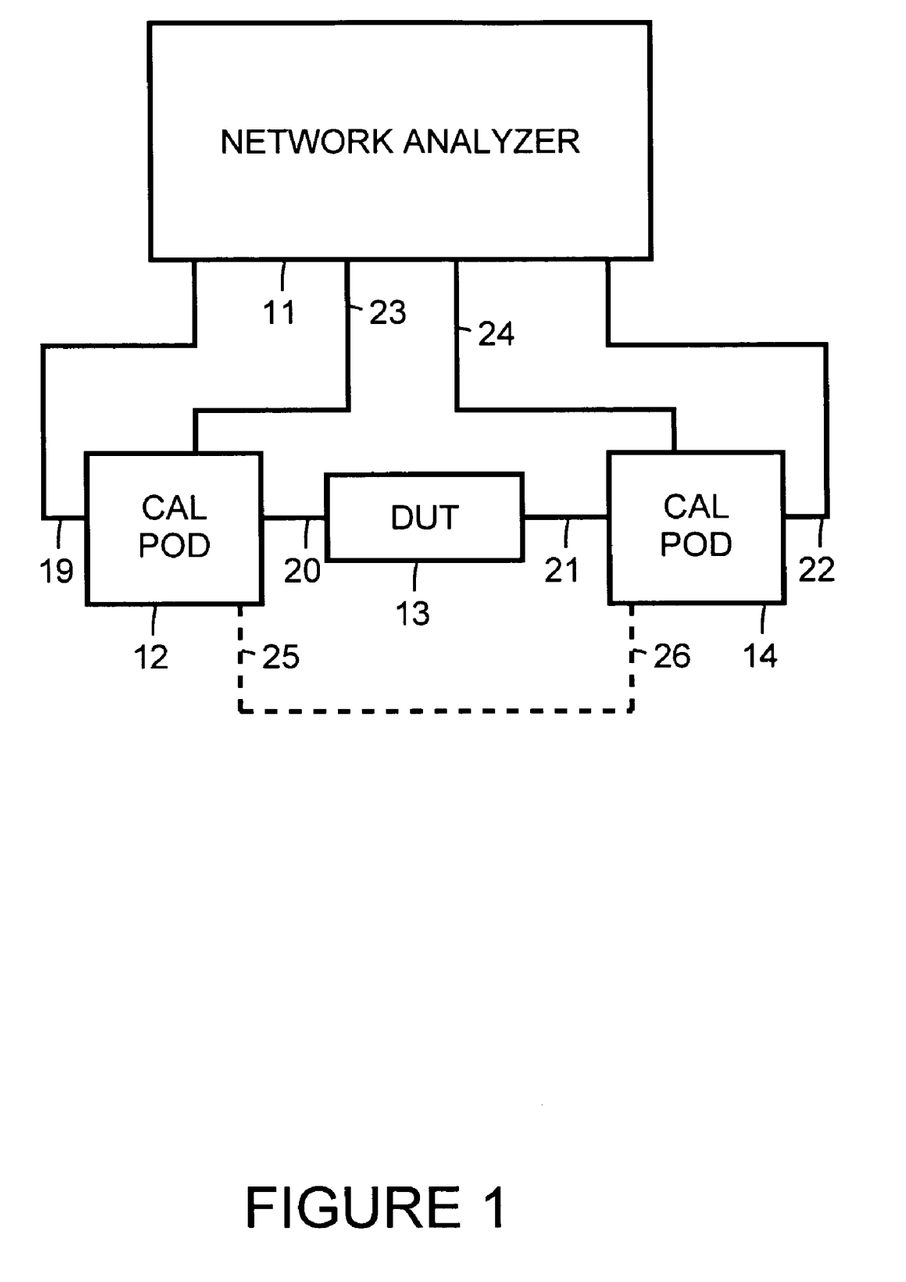
FIG. 1 is simplified block diagram showing calibration pod modules connected between a network analyzer and a device under test in accordance with an embodiment of the present invention.

FIG. 1 is a simplified block diagram showing a network analyzer 11 configured to perform tests on a device under test (DUT) 13. Network analyzer 11 is, for example a radio frequency (RF) or microwave vector network analyzer (VNA).

A calibration module (calpod) 12 and a calibration module (calpod) 14 are connected on either side of DUT 13. Calibration module 12 and calibration module 14 are electronically controlled network analyzer calibration devices with switchable input/output stage, power detector and noise source. Calibration module 12 and calibration module 14 remain connected to DUT 13 during testing, allowing network analyzer 11 to self-calibrate during testing of DUT 13. Time and temperature drift errors are reduced when measurement calibration can be performed whenever is desired without any connecting and disconnecting of the calibration modules.

A port 19 of calibration module 12 is connected to a port of network analyzer 11. A port 20 of calibration module 12 is connected to a port of DUT 13. A port 22 of calibration module 14 is connected to a port of network analyzer 11. A port 21 of calibration module 14 is connected to a port of DUT 13.

Network analyzer 11 controls calibration module 12 via communication through a USB connection 23. Network analyzer 11 controls calibration module 14 via communication through a USB connection 24. In addition to data transfer capabilities, USB connection 23 and USB connection 24 can be used to provide power respectively to calibration module 12 and calibration module 14. Other types of connection protocols, such as for parallel and serial ports, IEEE 1394, wireless protocols (e.g., Bluetooth, etc.) and so on can be used in addition to or instead of USB connections.

Calibration module 12 has a third port 25. Calibration module 14 has a third port 26. Third port 25 of calibration module 12 and third port 26 of calibration module 14 allow use of calibration module 12 and calibration module 14 with additional equipment, as further described below. In FIG. 1, the dotted line between port 25 of calibration module 12 and port 26 of calibration module 14 illustrates the optional presence of an radio frequency (RF) cable between port 25 of calibration module 12 and port 26 of calibration 14.

In the set-up shown in FIG. 1, dynamic one port s-parameter calibration correction calibration is performed at the cable test planes (i.e., at port 19 of calibration module 12 and port 22 of calibration module 14), and then shifted to the DUT test planes (i.e., at port 20 of calibration module 12 and port 21 of calibration module 14). Dynamic two port error correction is done by use of the "Unknown Thru" technique. The connection between port 25 of calibration module 12 and port 26 of calibration module 14 need not be present in order to achieve full two port error correction provided DUT 13 is passive. However, if DUT 13 is active, port 25 of calibration module 12 and port 26 of calibration module 14 can be connected using a standard RF cable to allow full two port error correction. In addition, one time connection between calibration modules 12 and 14 can be done in conjunction with drift tracking techniques in order to achieve dynamic two port error correction. Hence, correction of any drift errors can be performed without disconnecting DUT 13.

Calibration modules 12 and 14 can make power measurements on the source power generated from network analyzer 18. The measurement can be transferred to the receivers of the network analyzer 11 via USB connection 23 and USB connection 24. This allows a source and receiver power calibration to network analyzer 11.

Noise parameter impedance standards, or a hot/cold source can be provided to DUT 13 by calibration modules 12 and 14. This allows the noise parameter or noise figure measurement to be made on DUT 13 without any additional connections or disconnections.

Figure 2:
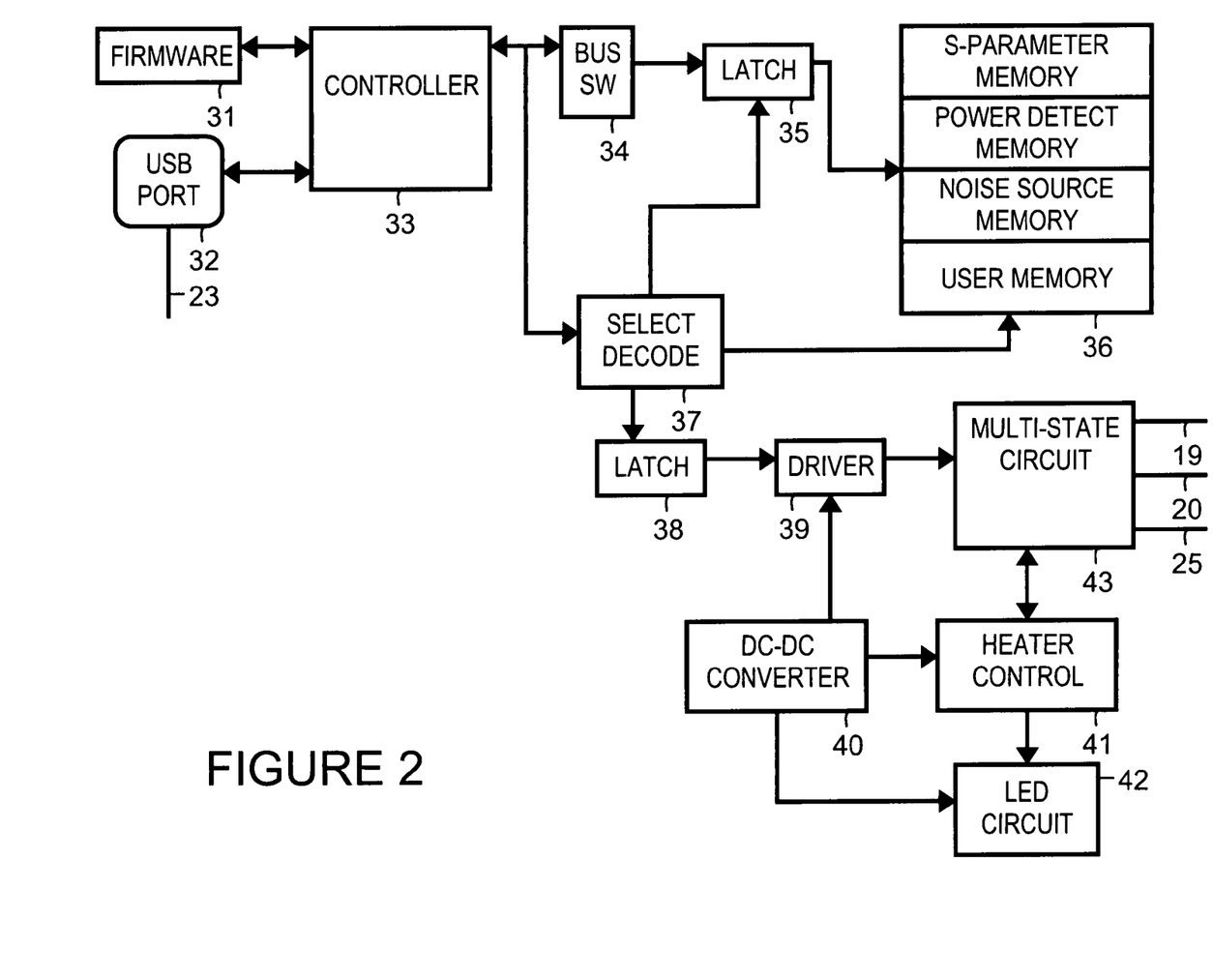
FIG. 2 is simplified block diagram of one of the calibration pod modules shown in FIG. 1 in accordance with an embodiment of the present invention.

FIG. 2 is simplified block diagram of calibration pod 12. A microcontroller 33 communicates with network analyzer 11 through a USB port 32 connected to USB connection 23. Programming for controller 33 is stored as firmware 31. A memory 36 includes s-parameter memory, power detect memory, noise source memory and user memory. The s-parameter memory stores a characterization of calibration module 12, which calibration module 12 makes available to network analyzer 11 when calibration module 12 is connected to network analyzer 11. The power detect memory is used to optionally store power characterization values for calibration module 12. The noise source memory is used to optionally store noise source characterization values for calibration module 12. User memory can be utilized by the user of the system to store characterization values that can be used in addition to or in place of the values in the s-parameter memory, the power detect memory and the noise source memory.

For example, memory 36 is composed of flash memory. Alternatively, memory 36 is composed of another type of computer readable non-volatile memory (e.g., read only memory, programmable ROM, EPROM, EEPROM, etc.) or computer readable volatile memory (e.g., random access memory, static RAM, dynamic, RAM, etc.).

A data path from controller 33 to memory 36 travels through a bus switch (SW) 34 and a latch 35. Control and address signals are generated by select decode 37 via instructions from controller 33. Select decode 37 provides instruction through latch 38 and driver 39 to a multi-state circuit 43. Multi-state circuit 43 is connected to port 19, port 20 and port 25 of calibration module 12. A DC—DC converter 40 provides power to driver 39, a heater control 41 and an LED circuit 42. Heater control 41 is used to stabilize the temperature of multi-state circuit 43.

Figure 3:
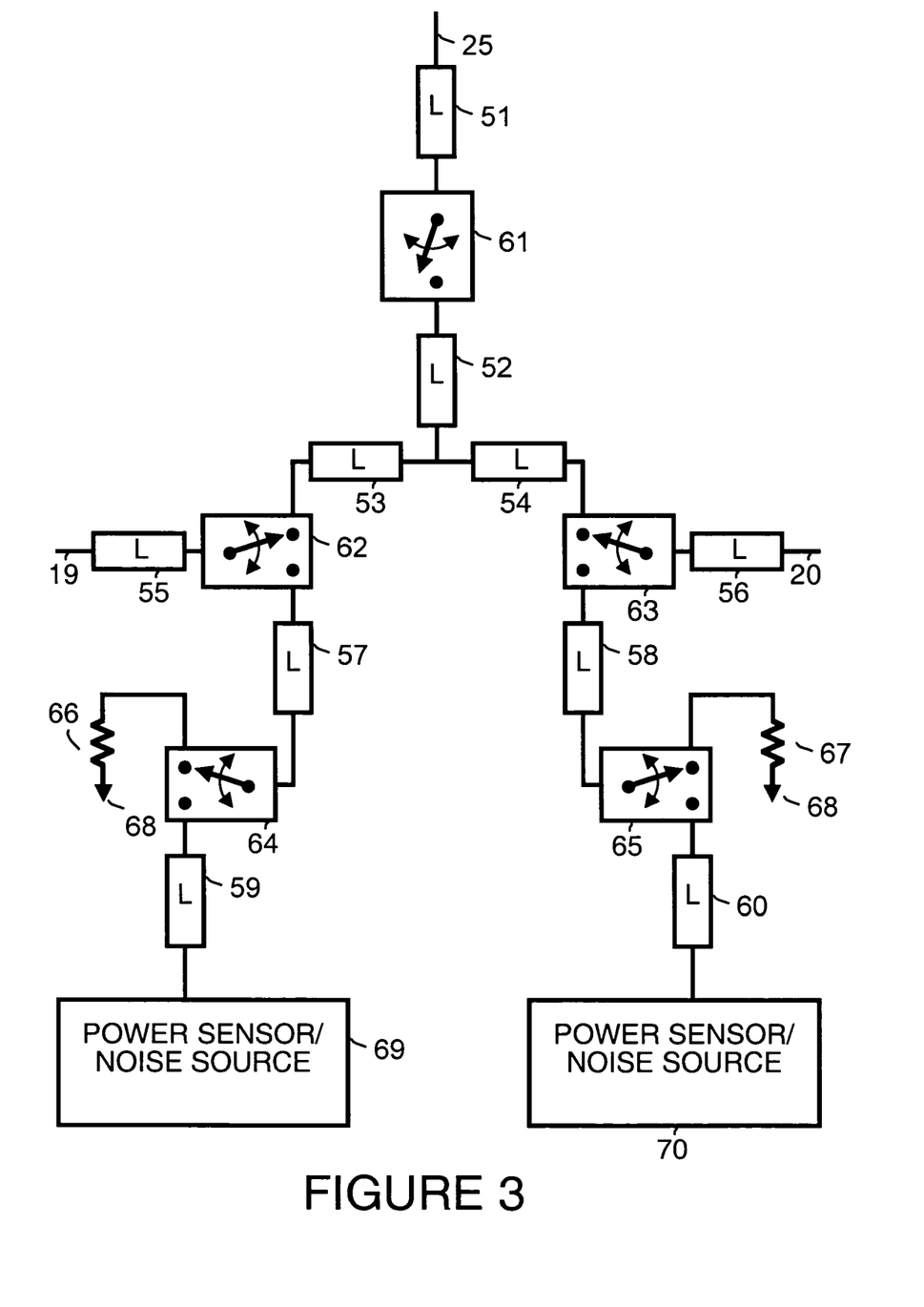
FIG. 3 is simplified block diagram of a multi-state circuit within the calibration pod module shown in FIG. 2 in accordance with an embodiment of the present invention.

FIG. 3 shows a block diagram of multi-state circuit 43. Multi-state circuit 43 includes a switch 61, a switch 62, a switch 63, a switch 64, a switch 65, a resistor 66 connected to a ground 68, a resistor 67 connected to ground 68, a transmission line (L) 51, a transmission line (L) 52, a transmission line (L) 53, a transmission line (L) 54, a transmission line (L) 55, a transmission line (L) 56, a transmission line (L) 57, a transmission line (L) 58, a transmission line (L) 59, a transmission line (L) 60, a power sensor/noise source 69 and a power sensor/noise source 70.

The switching topology of multi-state circuit 43 allows for up to three connections to be made (at port 19, port 20 and port 25). Multi-state circuit 43 can be implemented, for example, using integrated circuits, and/or discreet components. Either port 19 or port 20 can be connected to network analyzer 11 and the corresponding port is connected to DUT 13. Both port 19 and port 20 have the ability to provide variable reflective impedance standards for noise or s-parameter calibration.

Switches 61 through 65 are constructed, for example, using field effect transistors (FET). Switch 62 is constructed so as to be able to provide an open and a short to port 19. Switch 63 is constructed so as to be able to provide an open and a short to port 20.

During calibration, switches 61 through 65 are switched, for example, so as to provide open, short, load and through connections to port 19 and port 20 as necessary. One pole of switch 62 allows switch 62 to connect transmission line 55 to transmission line 53. One pole of switch 63 allows switch 63 to connect transmission line 56 to transmission line 54. One pole of switch 61 allows switch 61 to connect transmission line 51 to transmission line 52.

Port 25 acts as an input/output stage to either port 19 or port 20. A transmission path can be created from any port of multi-state circuit 43 to any of the two other ports. This added capability allows the injection or reception of signals to and from port 19 or port 20 to port 25.

Added power or noise hardware (power sensor/noise source 69 and power sensor/noise source 70) allow either power or noise correction to be built into calibration module 12 without the use of extra power meters or noise analyzers in the measurement setup.

As indicated above, third port 25 of calibration module 12 and third port 26 of calibration module 14 allow use of calibration module 12 and calibration module 14 with additional equipment. This is illustrated by FIG. 4.

Figure 4:
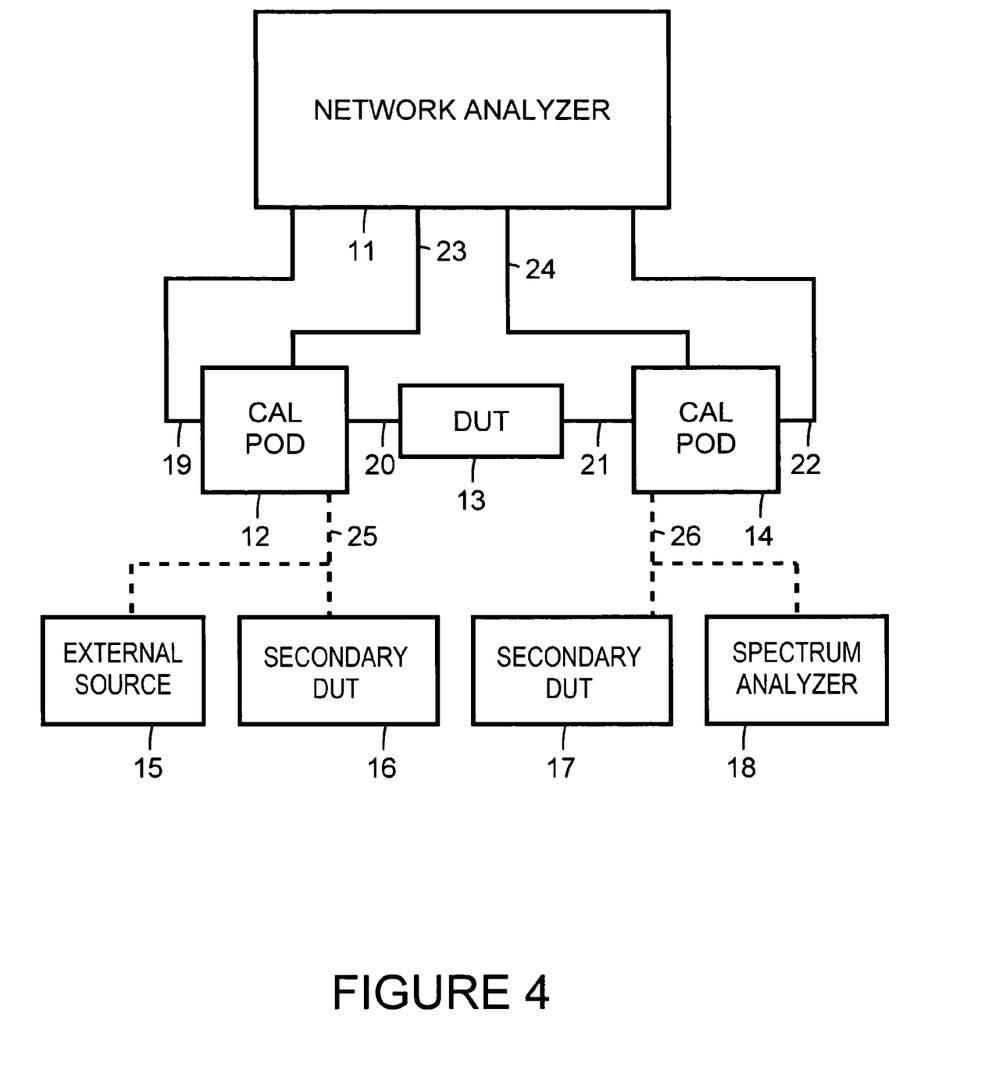
FIG. 4 is simplified block diagram showing additional hardware being connected to calibration pod modules in accordance with an embodiment of the present invention.

In FIG. 4, calibration module 12 is connected to an external source 15 or a secondary DUT 16 as indicated by the dotted line connections. For example, secondary DUT 16 can be monitored via port 25 of calibration module 12. Calibration module 12 allows the shifting of the calibration of the test plane located between port 20 of calibration module 12 and port 21 of calibration module 14 to third port 25 of calibration module 12. External source 15 can provide an external signal through calibration module 12.

Also, as illustrated by the dotted line connection, calibration module 14 is connected to a spectrum analyzer 18 or a secondary DUT 17. For example, secondary DUT 17 can be monitored via port 26 of calibration module 14. Calibration module 14 allows the shifting of the calibration of the test plane located between port 20 of calibration module 12 and port 21 of calibration module 14 to third port 26 of calibration module 14. Spectrum analyzer 18 can make additional measurements, for example, that network analyzer 11 cannot make without making any change in connections between network analyzer 11, calibration module 12, DUT 13 and calibration module 14.

Figure 5:
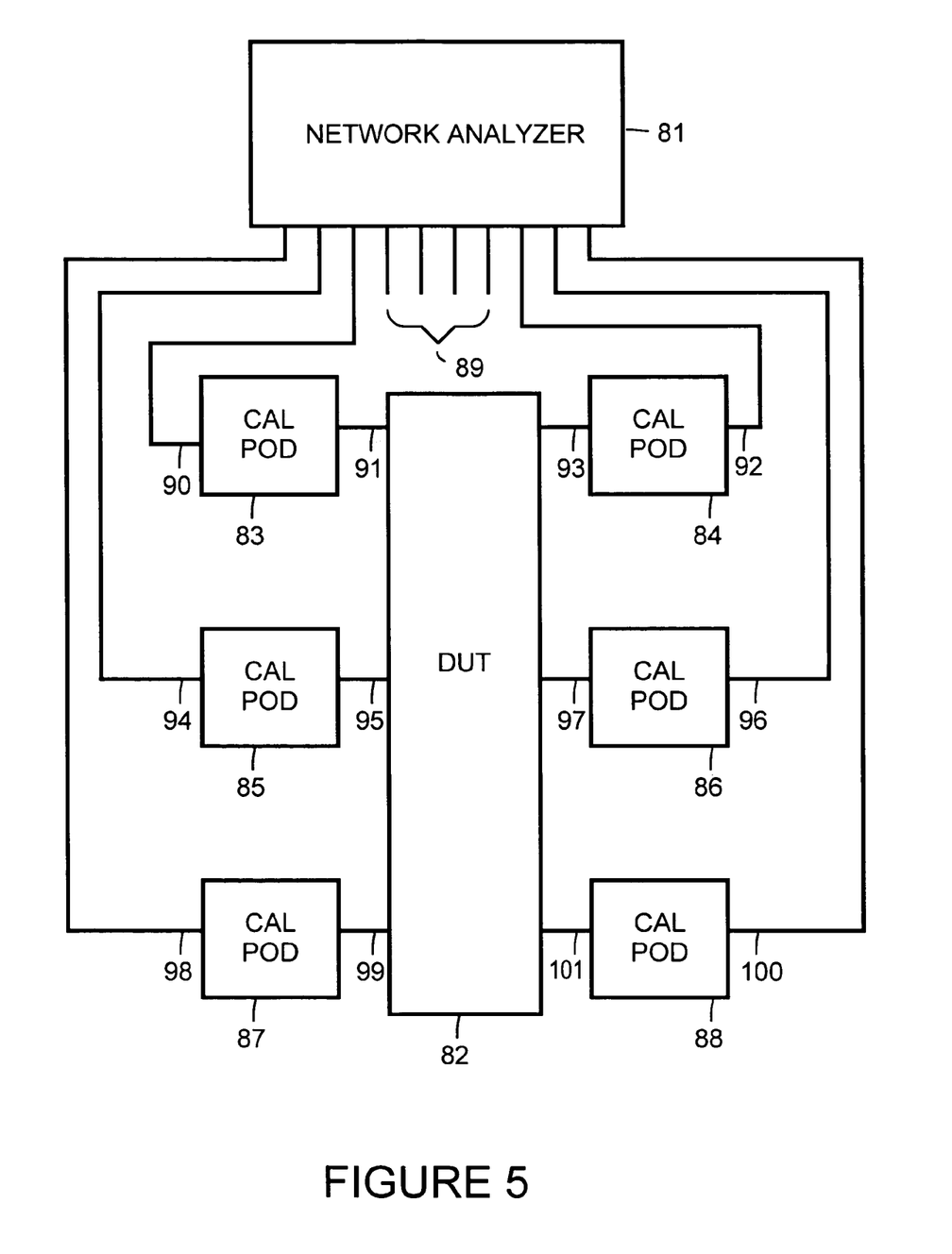
FIG. 5 is simplified block diagram showing another configuration of calibration pod modules connected between a network analyzer and a device under test in accordance with an embodiment of the present invention.

Calibration modules can be used in lots of different configurations to provide for automated electronic calibration. For example, FIG. 5 shows a calibration module (calpod) 83, a calibration module (calpod) 84, a calibration module (calpod) 85, a calibration module (calpod) 86, a calibration module (calpod) 87 and a calibration module (calpod) 88 configured to aid network analyzer 81 to take multi-port network analyzer measurements of a DUT 82. A port 90 of calibration module (calpod) 83 is connected to a port of network analyzer 81. A port 91 of calibration module 83 is connected to DUT 82. A port 92 of calibration module (calpod) 84 is connected to a port of network analyzer 81. A port 93 of calibration module 84 is connected to DUT 82. A port 94 of calibration module (calpod) 85 is connected to a port of network analyzer 81. A port 95 of calibration module 85 is connected to DUT 82. A port 96 of calibration module (calpod) 86 is connected to a port of network analyzer 81. A port 97 of calibration module 86 is connected to DUT 82. A port 98 of calibration module (calpod) 87 is connected to a port of network analyzer 81. A port 99 of calibration module 87 is connected to DUT 82. A port 100 of calibration module (calpod) 88 is connected to a port of network analyzer 81. A port 101 of calibration module 88 is connected to DUT 82. Network analyzer 81 includes additional ports 89 that are not used in the shown configuration. USB connections between network analyzer 81 and calibration modules 83 through 88 are present but not shown in FIG. 5.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A calibration module for connection between a device under test and a network analyzer comprising:
   a controller;
   a memory that stores calibration parameters for the calibration module; and,
   a multi-state circuit, including:
      a first port for connection to the device under test,
      a second port for connection to the network analyzer,
      a third port,
      a first switch connected to the first port,
      a second switch connected to the second port, and
      a third switch connected to the third port;
   wherein a first pole of the first switch, a first pole of the second switch, and a first pole of the third switch are all connected together through transmission lines.

2. A calibration module as in claim 1 wherein:
   the first switch includes field effect transistors arranged so that the first switch can provide an open to the first port and can provide a short to the first port; and,
   the second switch includes field effect transistors arranged so that the second switch can provide an open to the second port and can provide a short to the second port.

3. A calibration module as in claim 1 wherein:
   the first switch is connected to the first port through a transmission line;
   the second switch is connected to the second port through a transmission line; and,
   the third switch is connected to the third port through a transmission line.

4. A calibration module as in claim 1 additionally comprising:
   a data port operable to communicate with test equipment.

5. A calibration module comprising:
   a controller;
   a memory that stores calibration parameters for the calibration module;
   a multi-state circuit, including:
      a first port,
      a second port,
      a third port,
      a first switch connected to the first port,
      a second switch connected to the second port, and
      a third switch connected to the third port, wherein a first pole of the first switch, a first pole of the second switch, and a first pole of the third switch are all connected together through transmission lines;
   a fourth switch connected to a second pole of the first switch, a first pole of the fourth switch being connected to a first load; and, a fifth switch connected to a second pole of the second switch, a first pole of the fifth switch being connected to a second load.

6. A calibration module as in claim 5 additionally comprising:
a first power sensor being connected to a second pole of the fourth switch; and,
a second power sensor being connected to a second pole of the fifth switch.

7. A calibration module as in claim 5 additionally comprising:
a first noise source being connected to a second pole of the fourth switch; and,
a second noise source being connected to a second pole of the fifth switch.

8. A multi-state circuit for use within a calibration module, the calibration module being for connection between a device under test and a network analyzer, the multi-state circuit comprising:
a first port for connection to the device under test;
a second port for connection to the network analyzer;
a third port;
a first switch connected to the first port;
a second switch connected to the second port; and,
a third switch connected to the third port;
wherein a first pole of the first switch, a first pole of the second switch, and a first pole of the third switch are all connected together through transmission lines.

9. A multi-state circuit as in claim 8 wherein:
the first switch includes field effect transistors arranged so that the first switch can provide an open to the first port and can provide a short to the first port; and,
the second switch includes field effect transistors arranged so that the second switch can provide an open to the second port and can provide a short to the second port.

10. A multi-state circuit for use within a calibration module, comprising:
a first port for connection to the device under test;
a second port for connection to the network analyzer;
a third port;
a first switch connected to the first port;
a second switch connected to the second port;
a third switch connected to the third port, wherein a first pole of the first switch, a first pole of the second switch, and a first pole of the third switch are all connected together through transmission lines;
a fourth switch connected to a second pole of the first switch, a first pole of the fourth switch being connected to a first load; and,
a fifth switch connected to a second pole of the second switch, a first pole of the fifth switch being connected to a second load.

11. A multi-state circuit as in claim 10 additionally comprising:
a first power sensor being connected to a second pole of the fourth switch; and,
a second power sensor being connected to a second pole of the fifth switch.

12. A multi-state circuit as in claim 10 additionally comprising:
a first noise source being connected to a second pole of the fourth switch; and,
a second noise source being connected to a second pole of the fifth switch.

* * * * *

UNITED STATES PATENT AND TRADEMARK OFFICE
CERTIFICATE OF CORRECTION

PATENT NO. : 6,965,241 B1 Page 1 of 1
DATED : November 15, 2005
INVENTOR(S) : Liu et al.

It is certified that error appears in the above-identified patent and that said Letters Patent is hereby corrected as shown below:

<u>Title page,</u>
Item [56], References Cited, U.S. PATENT DOCUMENTS, after "Adamian" insert
-- et al. --.

Signed and Sealed this

Twenty-first Day of March, 2006

JON W. DUDAS
*Director of the United States Patent and Trademark Office*